United States Patent [19]

Corbett et al.

[11] 4,444,805

[45] Apr. 24, 1984

[54] OPTICAL COATING

[75] Inventors: Richard T. Corbett, Cambuslang; Brian C. Monachan; Alexander J. N. Hope, both of Glasgow, all of Scotland

[73] Assignee: Barr & Stroud Limited, Glasgow, Scotland

[21] Appl. No.: 276,259

[22] Filed: Jun. 22, 1981

[30] Foreign Application Priority Data

Jul. 17, 1980 [GB] United Kingdom ............... 8023435
Jun. 18, 1981 [GB] United Kingdom ............... 8118713

[51] Int. Cl.³ ............................................. B05D 3/02
[52] U.S. Cl. ........................................ 427/38; 427/41
[58] Field of Search ........................... 427/38, 10, 41

[56] References Cited

U.S. PATENT DOCUMENTS

| | | | |
|---|---|---|---|
| 3,776,762 | 12/1973 | Bernath | 427/38 |
| 3,961,103 | 6/1976 | Aisenberg | 427/39 |
| 4,170,662 | 10/1979 | Weiss et al. | 427/38 |
| 4,292,153 | 9/1981 | Kudo et al. | 427/38 |
| 4,311,725 | 1/1982 | Holland | 427/10 |
| 4,382,100 | 5/1983 | Holland | 427/38 |

FOREIGN PATENT DOCUMENTS 1582231 8/1977 United Kingdom.

*Primary Examiner*—Deborah L. Kyle
*Attorney, Agent, or Firm*—Finnegan, Henderson, Farabow, Garrett & Garrett

[57] ABSTRACT

A process for coating the surface of a material with a carbonaceous coating by vacuum deposition derives the carbon in substantially pure form from a hydrocarbon gas plasma, the surface to be coated being coupled to an A.C. power source operating at a frequency below 500 kHz at which the electrical impedance of the plasma is substantially non-varying during the deposition process. Because the plasma impedance is substantially constant the process is safe and reproducible and can be carried out without dynamic monitoring and adjustment procedures and there is no requirement for an impedance matching network between the A.C. power supply and the vacuum chamber. Frequencies in the range 300–400 kHz with applied voltages of the order of 1KV or greater have been found to give good results.

6 Claims, 1 Drawing Figure

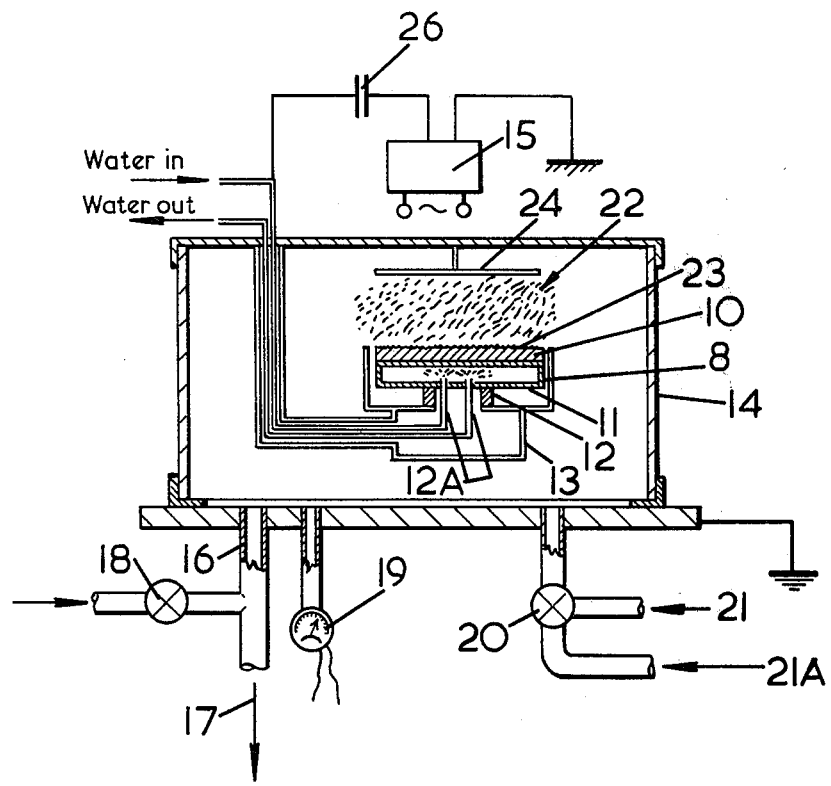

OPTICAL COATING

This invention relates to optical coatings and in particular to a process for optically coating the surface of a material with a carbonaceous coating, that is carbon either in pure form or containing only a low concentration by mass of impurities (such as hydrogen existing in C-H bonded form).

There are several known vacuum deposition processes for coating various forms of carbon onto surfaces but individually these processes have disadvantages which render the resultant product of unacceptable quality as is discussed in the NRDC German Patent Specification DOS No. 2736514 (corresponds to U.K. No. 1,582,231). For the production of carbonaceous coatings NRDC have proposed the use of a high frequency source, i.e. 500 kHz or greater, capacitively coupled to the deposition surface for establishment of a bias voltage on that surface to attract the positive ions from an ionised hydrocarbon gas in the vicinity of the surface, and it has been found by NRDC that the deposited film consists principally of carbon, i.e. it is carbonaceous.

We have now found that at the frequencies proposed by NRDC (i.e. 500 kHz and greater) the ionisation of hydrocarbon gases such as butane produces a plasma with an electrical impedance which is a complex variable of a number of parameters and these parameters vary during the deposition process resulting in variation of the plasma impedance and in lack of control, and non-repeatability, of the deposition process. This manifested itself in carbonaceous coatings of varying thickness from run to run. We have considered using a source coupled to the deposition chamber via an adjustable impedance matching unit and monitoring the deposition process and the power levels and providing adjustment facilities for the impedance matching unit in order to achieve constant deposition conditions which would be reproducible. Such arrangements, however, are complex and expensive.

We have discovered that during each run the parameters on which the plasma impedance depend include the pressure and the variation in pressure of the vacuum chamber, the nature of the hydrocarbon gas and of the material whose surface is to be coated, the electrode configuration and spacing within the chamber and the magnitude of the inter-electrode voltage, and we have surprisingly established that for a given set of such parameters the plasma impedance is substantially non-varying when deposition is carried out below a determinable frequency which is itself less than 500 kHz and that above the determinable frequency the plasma impedance varies in a complex manner during the deposition process.

In order that the carbon coating is of the carbonaceous type herein referred to it is necessary that the surface to be coated is bombarded by relatively high energy ions being sufficiently energetic to break or dissociate all or at least the vast majority of the C-H bonds present in the hydrocarbon gas from which the plasma is produced. This is achieved by using a relatively high voltage power supply to produce the plasma (of the order of 1 KV or greater) as distinct from much lower supply voltages (of the order of 500 V or less) which are known to produce coatings of altogether different optical characteristics containing substantial numbers of C-H bonds. These coatings are not 'carbonaceous coatings' as defined herein.

Accordingly the present invention provides a process for applying a carbonaceous coating to a surface by vacuum deposition of carbon derived from a hydrocarbon gas in plasma form, wherein the surface is coupled to an AC power supply operating at a frequency below 500 kHz at which the electrical impedance of the plasma is substantially non-varying during the deposition process.

It will be recognised that the present invention utilises frequencies of a relatively low level i.e. below 500 kHz which can be generated without using expensive equipment and because the plasma impedance is substantially constant throughout the deposition process the process is relatively safe and reproducible and can be carried out without dynamic monitoring and adjustment procedures and there is no requirement for an impedance matching network between the AC power supply and the vacuum chamber.

Preferably the process according to the invention is carried out at a pressure in the region of $6 \times 10^{-3}$ torr, the RMS voltage delivered by the power supply being in the region of 2 KV. At this pressure and voltage the nature of the hydrocarbon gas is not critical and although butane is the preferred hydrocarbon gas because it has ready commercial availability hydrocarbon gases of heavier or lighter molecular weight can be used.

Preferably with the pressure and voltage referred to above and utilising the electrical configuration illustrated in the accompanying drawing the power supply is of constant frequency, namely 300 kHz. With these parameters we have found that good optical quality diamond-like carbonaceous coatings can be deposited on such substrate materials as glass and germanium.

The accompanying drawing illustrates apparatus for applying a carbonaceous coating to a surface of a material by a process according to the present invention.

In the drawing, a substrate 10 of the material whose upper surface is to be coated is supported by a metal electrode 11 which is insulated at 12 from a grounded J-arm 13 hanging inside a grounded vacuum chamber 14. The electrode 11 is connected through an 800 pF blocking capacitor 26 to one terminal of a 300 kHz power supply 15 by two metal tubes 12A, which are also used to carry circulating cooling water to the electrode. The other terminal of the power supply 15 is grounded. A thin metal shield 8 supported by and connected to the J-arm 13 is arranged around the electrode 11 and together with a plate 24 hanging inside the chamber 14 serves to confine the discharge established within the chamber. The power supply 15 comprises a constant voltage generator and a transformer to provide voltage variability and the operating frequency may be either fixed or variable. The water carrying tubes 12A are at atmospheric pressure within J-arm 13 and electrode 11.

Attached to the chamber are an outlet port 16 connectable as indicated by the arrow 17 to a vacuum pump and to an air admission valve 18; a thermocouple vacuum gauge 19; and a tube connection to a needle valve 20 through which a selected gas may be supplied from a source as indicated by the arrows 21, 21A.

In operation, the chamber 14 is evacuated to about $2 \times 10^{-5}$ torr and argon is admitted from source 21 through the needle valve 20. The power supply 15 is energised so as to discharge between the electrode 11 and the grounded etchcatcher 24, which are about 9 cm apart to form an argon ion plasma. This discharge is continued for about 15 minutes at a pressure of $5.0 \times 10^{-3}$ torr with the power supply 15 delivering about 1.9 KV so as to clean the exposed surfaces of the substrate 10 very thoroughly and heat the substrate to the desired temperature. The argon is valved off and hydrocarbon gas (e.g. butane) from source 21A admitted instead, without stopping the discharge, which is continued for as long as required at a pressure of $5.0 \times 10^{-3}$ torr. Under these conditions, an extremely hard film of substantially pure carbon slowly builds up over the surface to be coated, as indicated by reference 23.

The substrate 10 may be conductive or non-conductive or semi-conductive and capacitor 26 may be shorted out if so desired, however capacitor 26 provides a simple method of controlling the arcing within the chamber 14 when the substrate 10 is conductive.

In another example we have generated plasmas at 390 kHz with a D.C. bias on the substrate support electrode 11 in the range 200-600 V from a power source operating in the range 0.5-1.5 KW at a voltage level of about 1.5 KV. The initial temperature of electrode 11 was 30° C. and the operating pressure during deposition was within the range 0.1 to 1.0 torr. Within these parameter ranges we have been able rapidly to produce good quality durable carbonaceous coatings on substrates such as germanium but we believe that coatings of similarly good quality would be achieved at increased pressure levels (up to 10.0 torr) and also at pressure levels within the range $1.0 \times 10^{-3}$ to 0.1 torr. In relation to the known NRDC process the coating time operating at 390 kHz was reduced by a factor of 2 and the coating area increased by a factor of 2 whilst uniformity of coating thickness was improved and absorption by the coating of radiation in the 8-12 micron band was reduced by 20%. The durability of the films produced by this process was measured to be in excess of 200,000 wipes on a standard wiper-acting test device (compatible with RSRE Technical Specification for Infra Red Optical Coatings, No. TS 1888) and, of course, in keeping with our invention the frequency utilised was below that at which the plasma impedance varied and in consequence the power source was directly coupled to the deposition chamber without any means of matching or dynamic control interposed.

It will be appreciated that the optical coatings which we have described are primarily intended to reduce surface reflectivity of substrates which in the visible range may be glass and in the infrared range may be germanium. The coatings may form a single film or one layer of a multilayer stack and may be used as controlled-density absorption filters for example on ophthalmic lenses. An alternative use of the optical coatings which we have described is to provide abrasion resistance to relatively soft optical materials in which case the coatings may or may not have anti-reflection properties.

What is claimed is:

1. A process for applying a carbonaceous coating to a surface by vacuum deposition of carbon derived from a hydrocarbon gas in plsma form, wherein the surface is coupled to an AC power supply operating at a frequency below 500 kHz at which the electrical impedance of the plasma is substantially non-varying during the deposition process.

2. A process as claimed in claim 1, wherein the pressure during the deposition process and the voltage delivered by the AC power supply is such that the nature of the hydrocarbon gas from which the plasma is derived is not critical.

3. A process as claimed in claim 2, wherein the pressure is in the range $1 \times 10^{-3}$ to 10.0 torr.

4. A process as claimed in claim 2 or claim 3, wherein the voltage is about 2 KV.

5. A process as claimed in claim 1, wherein prior to the deposition process the substrate is cleaned by an ion plasma derived from an inert gas.

6. A process as claimed in claim 1, wherein the substrate is initially at a predetermined temperature above ambient.

* * * * *

UNITED STATES PATENT AND TRADEMARK OFFICE
CERTIFICATE OF CORRECTION

PATENT NO. : 4,444,805
DATED : April 24, 1984
INVENTOR(S) : Richard T. Corbett et al.

It is certified that error appears in the above—identified patent and that said Letters Patent is hereby corrected as shown below:

Cover page - second column -- Attorney, Agent or Firm should be changed to read --Finnegan, Henderson, Farabow, Garrett & Dunner--.

Column 4, line 21 "plsma" should read --plasma--.

Signed and Sealed this

Fourth Day of December 1984

[SEAL]

Attest:

Attesting Officer

GERALD J. MOSSINGHOFF

Commissioner of Patents and Trademarks